United States Patent
Forbes

(10) Patent No.: US 7,477,542 B2
(45) Date of Patent: Jan. 13, 2009

(54) SPLIT GATE FLASH MEMORY CELL WITH BALLISTIC INJECTION

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 11/478,256

(22) Filed: Jun. 29, 2006

(65) Prior Publication Data

US 2006/0245256 A1   Nov. 2, 2006

Related U.S. Application Data

(62) Division of application No. 10/847,825, filed on May 18, 2004.

(51) Int. Cl.
*G11C 11/34* (2006.01)

(52) U.S. Cl. .............. 365/185.03; 365/185.18; 365/185.27

(58) Field of Classification Search ............ 365/185.27, 365/185.28, 185.3, 185.03, 185.18
See application file for complete search history.

(56) References Cited

U.S. PATENT DOCUMENTS

| | | | |
|---|---|---|---|
| 5,021,999 A * | 6/1991 | Kohda et al. ............ 365/185.03 |
| 5,460,988 A * | 10/1995 | Hong ........................ 438/259 |
| 5,596,526 A * | 1/1997 | Assar et al. ............ 365/185.17 |
| 5,703,387 A * | 12/1997 | Hong ........................ 257/315 |
| 5,717,632 A * | 2/1998 | Richart et al. ............ 365/185.2 |
| 5,930,634 A | 7/1999 | Hause et al. |
| 5,936,274 A | 8/1999 | Forbes et al. |
| 5,969,383 A | 10/1999 | Chang et al. |
| 6,093,606 A * | 7/2000 | Lin et al. ..................... 438/259 |
| 6,133,098 A | 10/2000 | Ogura et al. |
| 6,143,636 A | 11/2000 | Forbes et al. |
| 6,177,318 B1 | 1/2001 | Ogura et al. |
| 6,248,633 B1 | 6/2001 | Ogura et al. |
| 6,255,166 B1 * | 7/2001 | Ogura et al. ................. 438/257 |
| 6,266,278 B1 * | 7/2001 | Harari et al. ........... 365/185.18 |
| 6,359,807 B1 | 3/2002 | Ogura et al. |
| 6,366,500 B1 | 4/2002 | Ogura et al. |
| 6,406,945 B1 | 6/2002 | Lee et al. |
| 6,518,126 B2 | 2/2003 | Wu et al. |

(Continued)

OTHER PUBLICATIONS

P. Pavan, et al. "Flash Memory Cells—An Overview" Proceedings of the IEEE, vol. 85, No. 8, Aug. 1997 pp. 1248-1271.

(Continued)

*Primary Examiner*—Anh Phung
*Assistant Examiner*—Alexander Sofocleous
(74) *Attorney, Agent, or Firm*—Leffert Jay & Polglaze P.A.

(57) ABSTRACT

A split floating gate flash memory cell includes source/drain regions in a substrate. The split floating gate is insulated from the substrate by a first layer of oxide material and from a control gate by a second layer of oxide material. The sections of the floating gate are isolated from each other by a depression in the control gate. The cell is programmed by creating a positive charge on the floating gate and biasing the drain region while grounding the source region. This creates a virtual source/drain region near the drain region such that the hot electrons are accelerated in the narrow pinched off region. The electrons become ballistic and are directly injected onto the floating gate section adjacent to the pinched off channel region.

16 Claims, 6 Drawing Sheets

U.S. PATENT DOCUMENTS

| | | | |
|---|---|---|---|
| 6,542,412 | B2 | 4/2003 | Ogura et al. |
| 6,580,641 | B2 | 6/2003 | Wu et al. |
| 6,686,632 | B2 | 2/2004 | Ogura et al. |
| 6,709,934 | B2 | 3/2004 | Lee et al. |
| 6,714,456 | B1 | 3/2004 | Ogura et al. |
| 6,747,896 | B2 * | 6/2004 | Wong .................... 365/185.18 |
| 6,878,991 | B1 | 4/2005 | Forbes |
| 7,196,935 | B2 * | 3/2007 | Forbes .................... 365/185.28 |
| 7,196,936 | B2 * | 3/2007 | Forbes .................... 365/185.28 |
| 7,221,597 | B2 * | 5/2007 | Forbes .................... 365/185.28 |
| 7,274,068 | B2 * | 9/2007 | Forbes ........................ 257/321 |
| 2002/0130378 | A1 | 9/2002 | Forbes et al. |
| 2004/0057264 | A1 * | 3/2004 | Houdt et al. .................. 365/45 |
| 2005/0133851 | A1 | 6/2005 | Forbes |
| 2005/0138262 | A1 | 6/2005 | Forbes |
| 2005/0173755 | A1 | 8/2005 | Forbes |
| 2005/0242387 | A1 | 11/2005 | Forbes |

OTHER PUBLICATIONS

D. Kim, et al. "A 2Gb NAND Flash Memory with 0.044 um$^2$ Cell Size using 90nm Flash Technology" IEEE IEDM, 2002, 4 pgs.

J. Choi, et al. "Highly Manufacturable 1 Gb NAND Flash Using 0.12 um Process Technology" IEEE IEDM, 2001, 4 pgs.

Y. Naveh, et al. "Modeling of 10nm-Scale Ballistic MOSFET'S" IEEE Electron Device Letters, vol. 21, No. 5, May 2000, pp. 242-244.

S. Ogura, et al. "Low Voltage, Low Current, High Speed Program Step Gate Cell with Ballistic Direct Injection for EEPROM/Flash" Digest International Electron Devices Meeting, 1998, pp. 987-990.

T. Saito, et al. "Split Gate Cell with Phonon Assisted Ballistic CHE injection" VLSI Tech. Symp. Digest Technical Papers, 2000, pp. 126-127.

W. Long, et al. "Dual-Material Gate (DMG) Field Effect Transistor" IEEE Transactions on Electron Devices, vol. 46, No. 5, May 1999 pp. 865-870.

* cited by examiner

US 7,477,542 B2

SPLIT GATE FLASH MEMORY CELL WITH BALLISTIC INJECTION

RELATED APPLICATION

This Application is a Divisional of U.S. application Ser. No. 10/847,825, titled "SPLIT GATE FLASH MEMORY CELL WITH BALLISTIC INJECTION," filed May 18, 2004, (Pending) which is commonly assigned and incorporated herein by reference.

TECHNICAL FIELD OF THE INVENTION

The present invention relates generally to memory devices and in particular the present invention relates to split gate memory cells.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. One type of flash memory is a nitride read only memory (NROM). NROM has some of the characteristics of flash memory but does not require the special fabrication processes of flash memory. NROM integrated circuits can be implemented using a standard CMOS process.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions. The depletion region or space charge width can be made smaller by increasing the substrate or well doping. However, it is extremely difficult to scale the junction depths to 100 nm-200 nm (1000 Å to 2000 Å) since these are doped by ion implantation and diffusion.

Another problem with flash memories is program speed. Depending on threshold voltage levels, programming times in tenths of a second or more is not uncommon.

For the reasons stated above, and for other reasons stated below which will become apparent to those skilled in the art upon reading and understanding the present specification, there is a need in the art for a more scalable, higher performance flash memory transistor.

DETAILED DESCRIPTION

Figure 1:
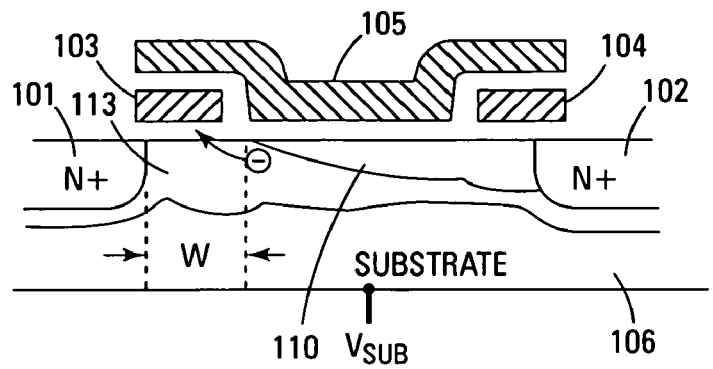
FIG. 1 shows a cross-sectional view of one embodiment of a planar split gate flash memory cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of one embodiment of a planar split gate flash memory cell of the present invention. The cell is comprised of a substrate 106 that has two n+ doped regions 101 and 102 that act as source/drain regions. The function of the region 101 or 102 is determined by the direction of operation of the memory cell. In the embodiment of FIG. 1, the substrate 106 is a p-type material and the source/drain regions 101 and 102 are n-type material. However, alternate embodiments may have an n-type substrate with p-type source/drain regions.

A channel region 110 is formed between the source/drain regions 101 and 102. During a program operation, as is well known in the art, the electrons are injected from a pinched off area of the channel region 110 to a floating gate 103 or 104. The electrons flow in the opposite direction during an erase operation.

The split floating gate 103 and 104, typically made of doped polysilicon, is disposed over the channel region 110. The floating gate sections 103 and 104 are electrically isolated from the substrate by a dielectric layer. For example, a gate oxide can be formed between the floating gate 103 and 104 and the channel region 110.

A control gate 105 is located over the floating gate 103 and 104 and can also be made of doped polysilicon. The control gate 105 is electrically separated from the floating gates 103 and 104 by another dielectric layer. Thus, the floating gate 103 and 104 is "floating" in dielectric so that they are insulated from both the channel region 110 and the control gate 105. A depression portion of the control gate 105 physically separates or "splits" the floating gate 103 and 104 such that two charge storage areas are created.

In operation, the memory cell of the present invention employs ballistic direction injection to perform a programming operation. The ballistic direction injection provides lower write times and currents.

The ballistic direction injection is accomplished by initially over-erasing the cell. This may be done during a functional test. The over-erase operation leaves the floating gate sections 103 and 104 with an absence of electrons (i.e., in a positive charge state) and creating a "virtual" source/drain region 113 near the source/drains regions. The virtual source/drain region 113 has a lower threshold voltage than the central part of the channel 110 and is either an ultra thin sheet of electrons or a depleted region with a low energy or potential well for electrons.

When the transistor is turned on with an applied drain voltage, a variation in potential energy is created along the surface of the semiconductor, as will be illustrated later with reference to FIG. 4. A potential well or minimum for electrons exists due to the positive floating gate charge. When the transistor is turned on, these potential energy minimums for electrons cause a higher density of electrons near the source. Thus the channel pinches off further away 113 from the drain 101 than normal. The length of the pinched-off region 113 is determined by the length of the floating gates that have sub-lithographic minimal dimensions. Hot electrons accelerated in the narrow region 113 near the drain 101 become ballistic and are directly injected onto the floating gate 103.

In one embodiment, this pinched-off region 113 is in a range of 10-40 nm (100-400 Å). Alternate embodiments have different ranges depending on floating gate length.

The flash memory transistor of the present invention is symmetrical and can be operated in either direction to create two possible storage regions when operated in a virtual ground array. Therefore, the above operation description can be applied to the operation of the transistor when the remaining source/drain region 102 is biased such that it operates as a drain region.

In one embodiment, a substrate or well voltage, $V_{sub}$, is used to assist during a program operation. The substrate bias enables the floating gates to store injected electrons in excess of those that would be stored without the substrate bias. Without the bias, the program process is self-limiting in that when enough electrons have been collected on a floating gate, the gate tends to repel any further electrons. The substrate bias results in a significant negative charge to be written to the floating gate. The substrate bias is not required for proper operation of the embodiments of the present invention.

In one embodiment, the substrate bias is a negative voltage in a range of –1V to –2V. Alternate embodiments use other voltages.

Figure 2:
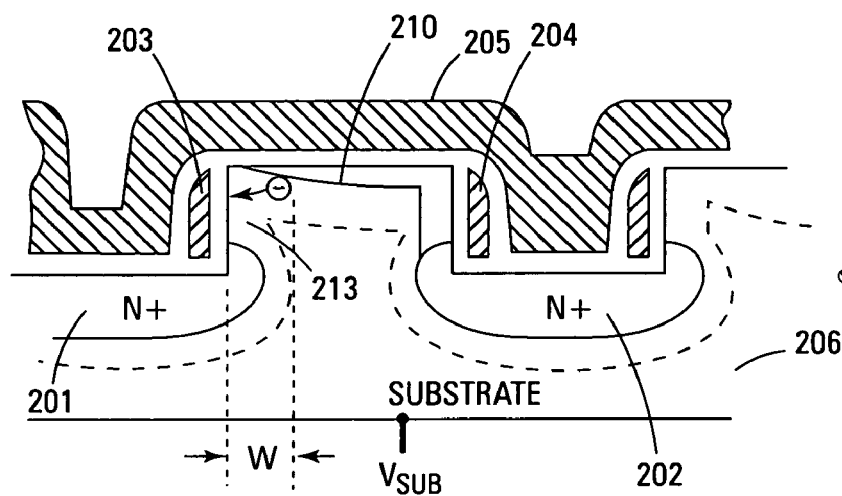
FIG. 2 shows a cross-sectional view of one embodiment of a vertical split gate flash memory cell of the present invention.

FIG. 2 illustrates a cross-sectional view of one embodiment of a vertical split gate flash memory cell of the present invention. The transistor is comprised of a substrate 206 that includes a plurality of doped regions 201 and 202 that act as source/drain regions. In one embodiment, the substrate is a p-type material and the doped regions are n-type material. Alternate embodiments use an n-type substrate with opposite type doped regions 201 and 202.

The substrate forms a pillar between two floating gates 203 and 204. This provides electrical isolation of the floating gates 203 and 204. A control gate 205 is formed over the floating gates 203 and 204 and substrate pillar.

A channel region 210 is formed between the floating gates 203 and 204. Additionally, as in the planar embodiment of FIG. 1, a virtual source/drain region 213 is formed by an over-erase operation leaving the floating gates 203 and 204 with an absence of electrons (i.e., in a positive charge state). However, in the vertical split gate embodiment, the virtual source/drain region 213 and channel region 210 are two-dimensional in that they wrap around the corners of the substrate pedestal.

The operation of the vertical split gate transistor embodiment of FIG. 2 is substantially similar to the operation described above for the planar embodiment. A drain bias is applied to one of the source/drain regions 201 or 202 that causes the channel region 210 nearest the drain to pinch off 213 further away from the drain 201 than normal. Hot electrons accelerated in the narrow region 213 near the drain 201 become ballistic and are directly injected onto the floating gate 203. The embodiment of FIG. 2 is also symmetrical and can be operated in either direction such that two storage regions 203 or 204 are possible when operated in a virtual ground array.

In one embodiment, a substrate or well voltage, $V_{sub}$, is used to assist during a program operation. The substrate bias enables the floating gates to store injected electrons in excess of those that would be stored without the substrate bias. In one embodiment, the substrate bias is a negative voltage in a range of –1 to –2 V. Alternate embodiments use other voltages. The substrate bias is not required for proper operation of the embodiments of the present invention.

Ballistic direction injection is easiest to achieve in a device structure where part of the channel is vertical as illustrated in the embodiment of FIG. 2. Lower write current and times are used since the geometry is conducive to hot electrons being accelerated by the electric fields. Hot electrons coming off of the pinched off end of the channel can be injected onto the floating gates without undergoing any collisions with the atoms in the lattice.

Figure 3:
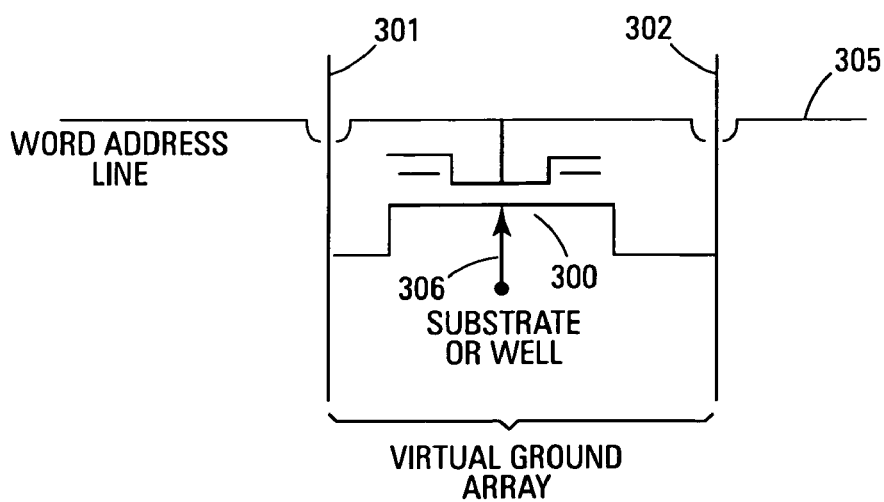
FIG. 3 shows an electrical schematic view of the embodiments of FIGS. 1 and 2.

FIG. 3 illustrates an electrical schematic view of both the planar and vertical split gate embodiments described in FIGS. 1 and 2. The memory cell symbol shows the transistor 300 with the substrate or well bias 306. The virtual ground array is the bit/data lines 301 and 302. These are illustrated in FIGS. 1 and 2 as the source/drain regions 101, 102, 201, and 202, respectively. The word address line 305 is illustrated in FIGS. 1 and 2 as the control gate 105 and 205, respectively.

Figure 4:
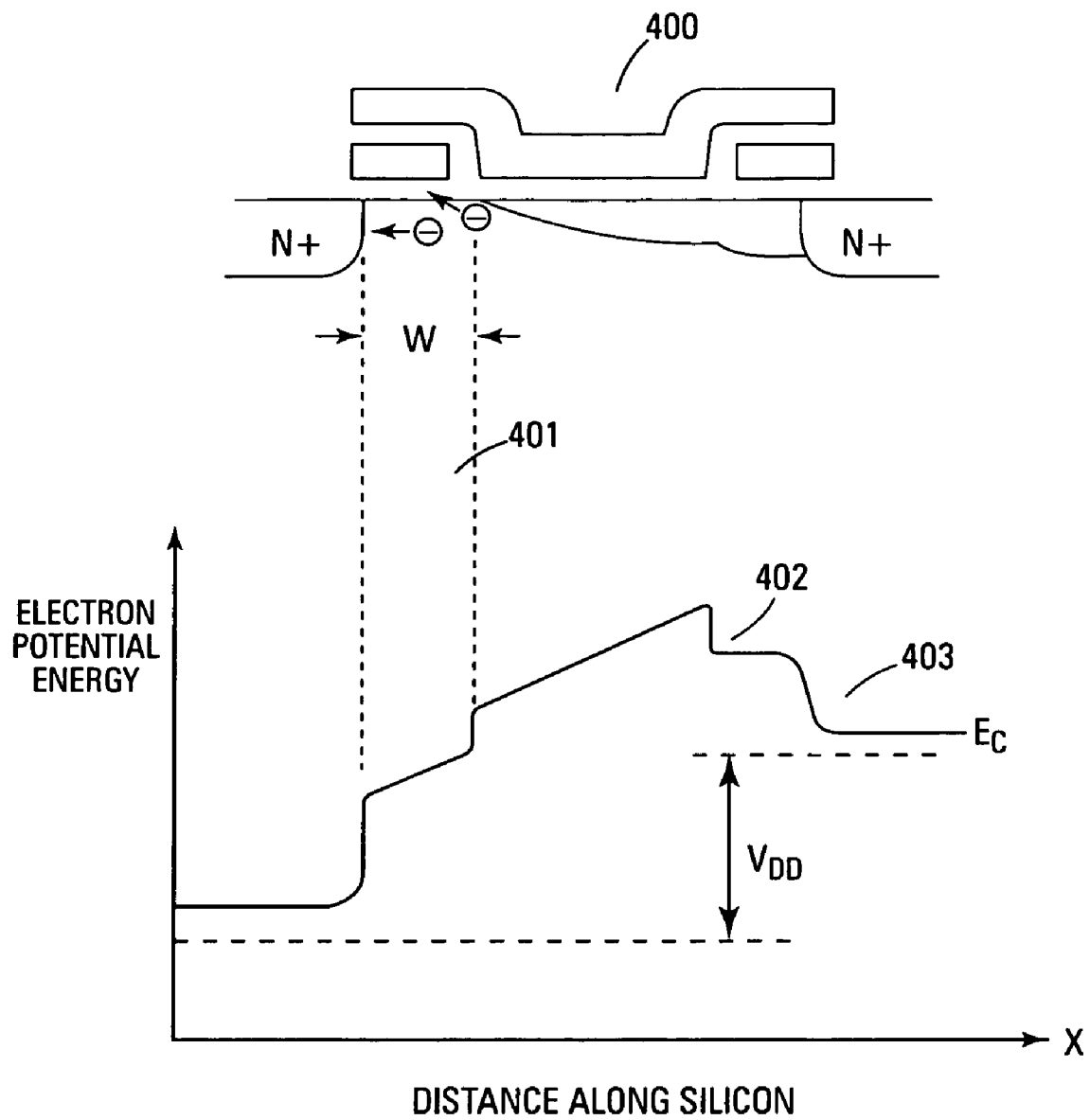
FIG. 4 shows a plot of one embodiment of the potential energy for electrons along the surface of the embodiment of FIG. 1.

FIG. 4 illustrates a plot of one embodiment of the potential energy for electrons along the surface of the planar embodiment of FIG. 1. The plot for the vertical split gate embodiment is substantially similar and is not illustrated herein in the interest of brevity.

The plot of FIG. 4 shows that the electron potential energy increases as the distance increases from the drain of the transistor 400. The ballistic transport region 401 is indicated adjacent the drain region and is indicated as 10-40 nm wide. However, alternate embodiments may use different ballistic transport region widths, depending on the width of the floating gate. The electron potential energy sharply drops at the second floating gate and drops further 403 in response to the source region.

Figure 5A:
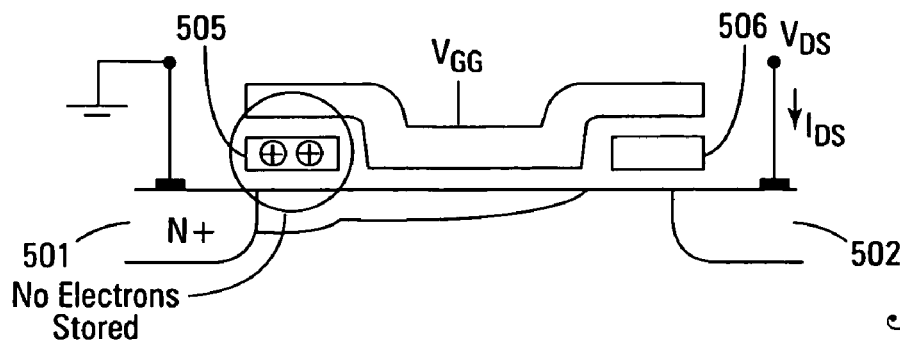
FIGS. 5A and 5B show a cross-sectional view of one embodiment of a read operation of the present invention in accordance with the embodiment of FIG. 1.
Figure 5B:
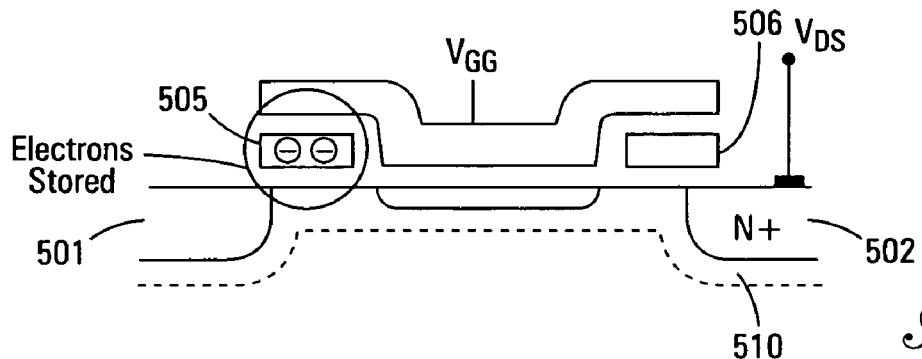

FIGS. 5A and 5B illustrate a read operation in one direction for the planar embodiment transistor of the present invention. Referring to FIG. 5A, the left side source/drain region 501 is grounded while the right side source/drain region 502 acts as a drain with a drain voltage applied ($V_{DS}$). A relatively smaller gate voltage ($V_{GG}$), near threshold, is applied to turn on the transistor. If there are no electrons stored on the left floating gate 505, the channel near the source region 501 turns on and the channel conducts such that drain current $I_{DS}$ flows.

FIG. 5B illustrates an embodiment where the left floating gate 505 has electrons stored such that the portion of the channel near the source region 501 does not turn on and the channel will not conduct. This results in no drain current flow. A large drain voltage is applied to fully deplete the region 510 near the drain 502 so that the charge state of the floating gate 506 on the right side cannot determine the conductivity state of the cell.

Figure 6A:
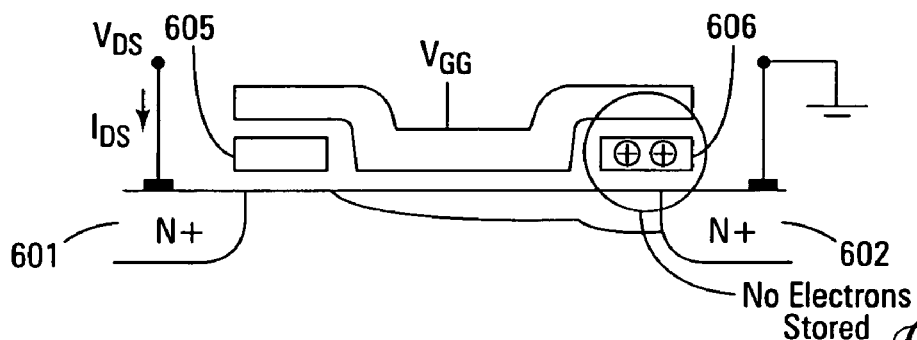
FIGS. 6A and 6B show a cross-sectional view of another embodiment of a read operation of the present invention in accordance with the embodiment of FIG. 1.
Figure 6B:
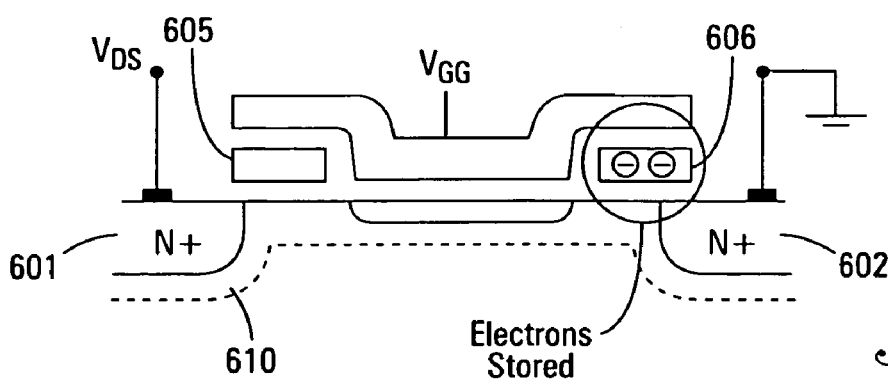

FIGS. 6A and 6B illustrate a read operation in the opposite direction than that illustrated in FIGS. 5A and 5B. In this embodiment, as illustrated in FIG. 6A, the right source/drain region 602 is grounded and a drain voltage is applied to the left source/drain region 601 that is now acting as the drain.

A relatively smaller gate voltage (e.g., near threshold) is applied in order to turn on the transistor. If no electrons are stored on the right floating gate 606, the portion of the channel near the source 602 turns on and the channel conducts. This results in a drain current $I_{DS}$ flow.

FIG. 6B illustrates an embodiment where the right floating gate 606 has stored electrons. In this embodiment, the channel near the source 602 does not turn on and the channel will not conduct. This results in no drain current flow. A large drain voltage, VDS, is applied to the drain 601 to fully deplete the region 610 near the drain 601 so that the charge state of the left floating gate 605 cannot determine the conductivity state of the cell.

FIGS. 7A-7D illustrate a cross-sectional view of one embodiment of a fabrication method of the present invention in accordance with the planar embodiment of FIG. 1. The following fabrication methods in both FIGS. 7 and 8 refer to a p-type substrate and n-type conductivity doped regions. However, the present invention is not limited to this type of transistor.

Figure 7A:
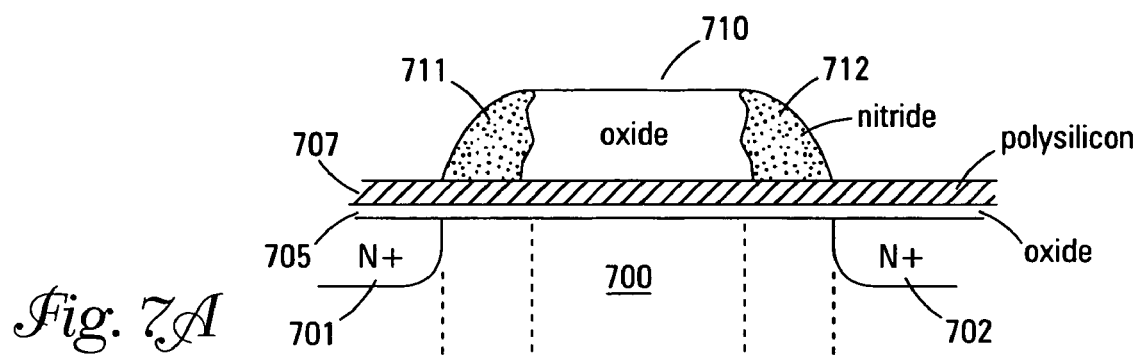
FIGS. 7A-7D show a cross-sectional view of one embodiment of a fabrication method of the present invention in accordance with the embodiment of FIG. 1.

The fabrication method illustrated in FIG. 7A begins with a p-type conductivity silicon substrate 700 that is doped in a plurality of source/drain regions 701 and 702 to n-type conductivity material. Each transistor is comprised of a source region and a drain region where the orientation is determined by the direction of operation of the transistor.

An oxide layer 705 is deposited on the surface of the substrate 700. A polysilicon layer 707 is deposited on top of the oxide layer 705. As discussed subsequently, the polysilicon layer 707 eventually becomes the floating gates that are insulated from the substrate by the oxide layer 705.

An oxide pillar 710 is grown on top of the polysilicon layer 707 substantially between the n+ regions 701 and 702. Nitride areas 711 and 712 are formed on either side of the oxide pillar 710. In one embodiment, each nitride area is in a range of 10-40 nm wide. A sidewall process that is well known in the art is used to define these sublithographic in a 100 nm technology and etch the short floating gates.

Figure 7B:
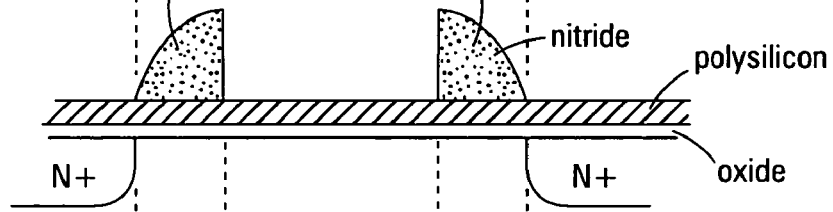
Figure 7C:
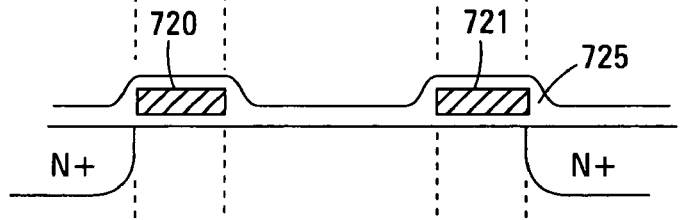

FIG. 7B shows that the oxide pillar is removed to leave the nitride areas 711 and 712 that protect the areas in the polysilicon layer that are to become the floating gates. FIG. 7C etches away the nitride areas as well as the portions of the polysilicon layer that is exposed. This leaves the two floating gates 720 and 721. Another oxide layer 725 is then formed over the floating gates 720 and 721.

Figure 7D:
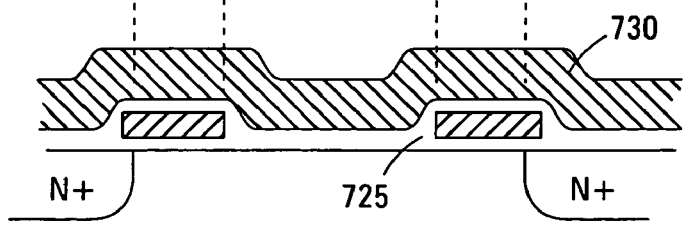

FIG. 7D shows that a layer of polysilicon 730 is deposited over the upper oxide layer 725. The polysilicon layer 730 forms the control gate for the transistor. The virtual ground array configuration insures that all components of the device structure are self-aligned and that there are no critical alignment steps.

FIGS. 8A-8E show a cross-sectional view of one embodiment of a fabrication method of the present invention in accordance with the vertical, split gate embodiment of FIG. 2. The process begins with a silicon p-type substrate 800 on which an oxide layer 801 and a nitride layer 803 are formed.

Figure 8A:
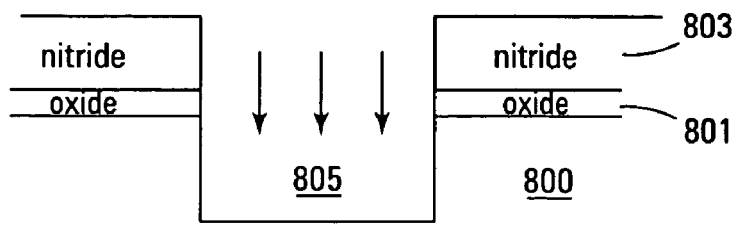
FIGS. 8A-8E show a cross-sectional view of one embodiment of a fabrication method of the present invention in accordance with the embodiment of FIG. 2.
Figure 8B:
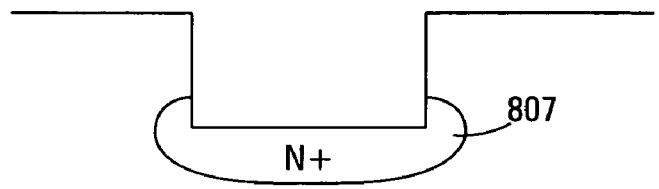
Figure 8C:
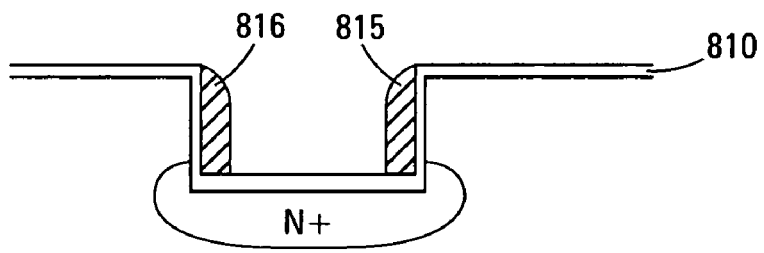

A trench 805 is then etched into the substrate and through the two upper layers 801 and 803. FIG. 8B shows that an n+doped region 807 is formed under the trench to act as a source/drain region 807. FIG. 8C shows that a layer of oxide 810 is deposited on the substrate and in the trench. The split gates are formed by a sidewall process growing polysilicon areas 815 and 816 on the inside sidewalls of the oxide layer 810 in the trench. The length of the split gates 815 and 816 are defined by the depth of the trench and by the use of the sidewall process. The sidewall process is well known in the art and is not discussed further.

Figure 8D:
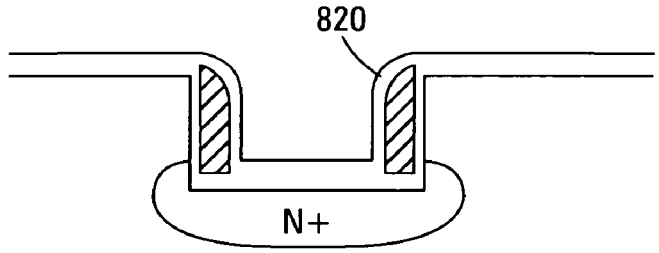
Figure 8E:
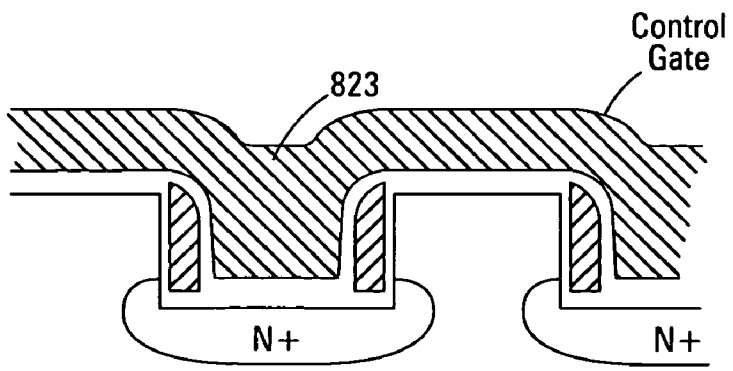

FIG. 8D shows an oxide layer 820 is deposited on top of the floating gates in the trench and over the oxide layer outside the trench. FIG. 8E illustrates the deposition of a polysilicon layer 823 that acts as the control gate for the transistor.

While the fabrication methods illustrated in FIGS. 7 and 8 focus on only one flash transistor, it is well known in the art that this fabrication method is used to fabricate millions of transistors on an integrated circuit.

Figure 9:
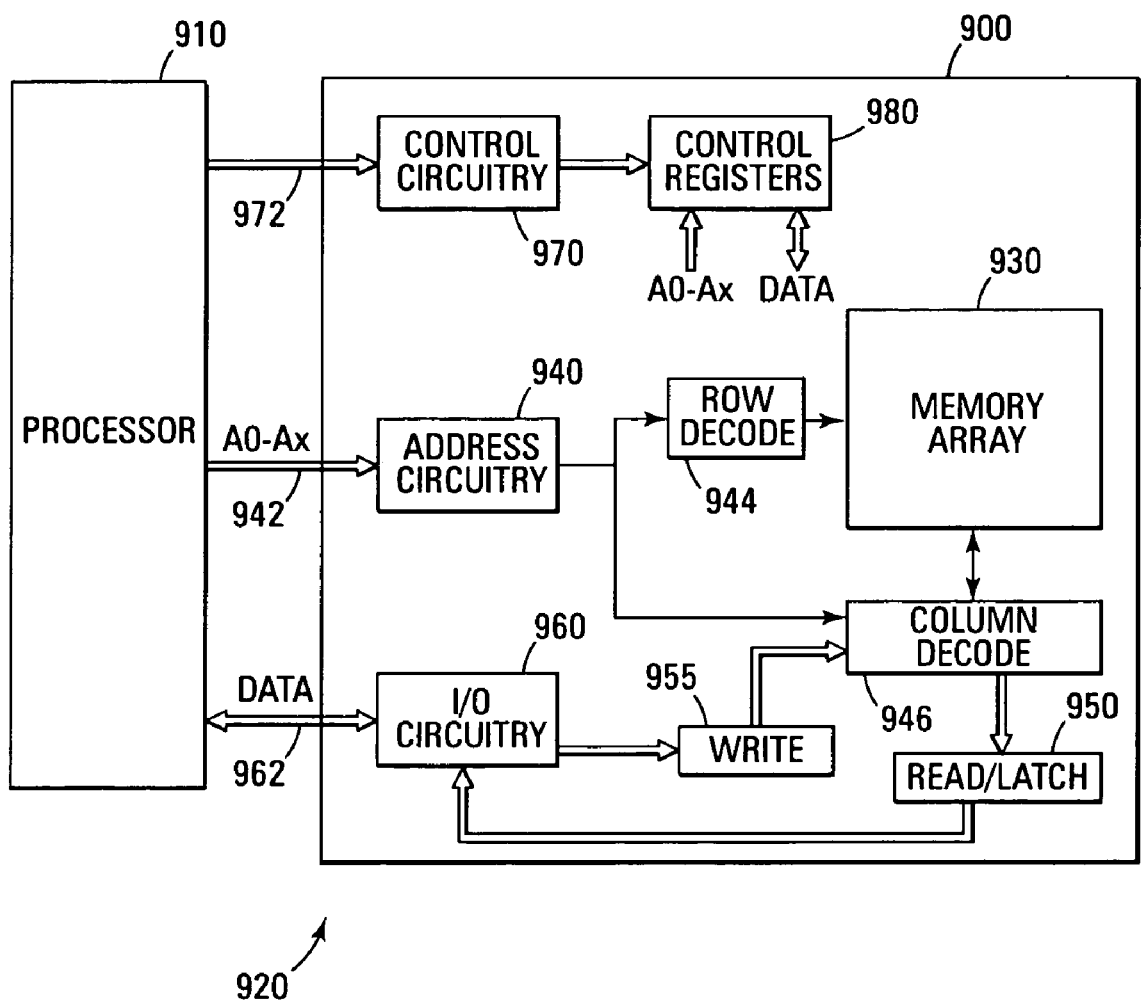
FIG. 9 shows a block diagram of an electronic system of the present invention.

FIG. 9 illustrates a functional block diagram of a memory device 900 that can incorporate the flash memory cells of the present invention. The memory device 900 is coupled to a processor 910. The processor 910 may be a microprocessor or some other type of controlling circuitry. The memory device 900 and the processor 910 form part of an electronic system 920. The memory device 900 has been simplified to focus on features of the memory that are helpful in understanding the present invention.

The memory device includes an array of flash memory cells 930 that can be floating gate flash memory cells. The memory array 930 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 940 is provided to latch address signals provided on address input connections A0-Ax 942. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense/buffer circuitry 950. The sense/buffer circuitry, in one embodiment, is coupled to read and latch a row of data from the memory array 930. Data input and output buffer circuitry 960 is included for bi-directional data communication over a plurality of data connections 962 with the controller 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, a planar flash memory device uses a combination of very short split floating gate regions and substrate bias to accelerate electrons near a drain region during a write operation. In one embodiment, the floating gate regions are 10-40 nm in length. Using the ballistic direction injection, electrons can be accelerated over a short distance and easily overcome the silicon-oxide interface potential barrier and be injected onto the floating gate.

In the case of flash memory devices where at least part of the channel is vertical, the geometry is more favorable for ballistic transport electrons being incident on the silicon-oxide interface and being directly injected over this barrier onto the floating gate. These electrons will not undergo collisions with the lattice atoms. Write currents and times will be lower and substrate bias is not required.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a vertical memory cell in a memory array, each vertical cell comprising split floating gate sections located along sidewalls of a pedestal formed in a substrate having two source/drain regions and a control gate formed between the floating gate sections, the two source/drain regions linked by a channel in the substrate, the method comprising:
    over-erasing a first section of the floating gate to form a positive charge on the first section;
    biasing a first source/drain region at ground potential;
    applying a gate voltage to the control gate wherein the gate voltage is less than a threshold voltage for the vertical memory cell;
    applying a drain voltage to the second source/drain region such that a channel in a two-dimensional channel region is pinched off and a virtual source/drain region forms along the sidewall adjacent to the first section of the split floating gate; and
    applying a negative bias to the substrate.

2. The method of claim 1 wherein the two-dimensional channel region is formed around the sidewalls of the pedestal.

3. The method of claim 1 wherein a portion of the channel adjacent the first source region does not turn on such that the channel does not conduct.

4. The method of claim 3 wherein the non-conducting channel results in no drain current flow.

5. The method of claim 1 wherein the drain voltage is large enough to fully deplete the channel region adjacent to the second source/drain region.

6. The method of claim 5 wherein the first source/drain region is acting as a source and the second source/drain region is acting as a drain.

7. The method of claim 6 wherein an electron potential energy increases as a distance increases from the drain.

8. The method of claim 1, wherein applying a negative bias comprises applying a bias of approximately −1 to −2 volts.

9. The method of claim 1, wherein the two-dimensional channel region is pinched off in a range of 10-40 nanometers.

10. A method for operating a vertical memory cell in a memory array, each vertical cell comprising split floating gate sections located along sidewalls of a pedestal formed in a substrate having two source/drain regions and a control gate formed between the floating gate sections, the two source/drain regions linked by a channel in the substrate, the method comprising:
    over-erasing a first section of the floating gate to form a positive charge on the first section;
    biasing a first source/drain region at ground potential;
    applying a gate voltage to the control gate wherein the gate voltage is less than a threshold voltage for the vertical memory cell;
    applying a drain voltage to the second source/drain region such that a channel in a two-dimensional channel region is pinched off and a virtual source/drain region forms along the sidewall adjacent to the first section of the split floating gate; and
    applying a negative bias to the substrate;
    wherein the two-dimensional channel region is formed around the sidewalls of the pedestal; and
    wherein a portion of the channel adjacent the first source region does not turn on such that the channel does not conduct.

11. The method of claim 10, wherein applying a negative bias comprises applying a bias of approximately −1 to −2 volts.

12. The method of claim 10, wherein the two-dimensional channel region is pinched off in a range of 10-40 nanometers.

13. A method for reading a vertical memory cell in a memory array, each vertical cell comprising split floating gate sections located along sidewalls of a pedestal formed in a substrate having two source/drain regions and a control gate formed between the floating gate sections, the two source/drain regions linked by a channel in the substrate, the method comprising:
    biasing a first source/drain region at ground potential;
    applying a drain voltage to the second source/drain region such that a channel in a two-dimensional channel region is pinched off and a virtual source/drain region forms along the sidewall adjacent to the first section of the split floating gate;
    applying a gate voltage to the control gate wherein the gate voltage is less than a threshold voltage for the vertical memory cell; and
    monitoring current flow in the second drain source region, wherein an erased cell conducts a current from drain to source and a programmed cell does not conduct a current from drain to source.

14. The method of claim 13, and further comprising: applying a negative bias to the substrate.

15. The method of claim 14, wherein applying a negative bias comprises applying a bias of approximately −1 to −2 volts.

16. The method of claim 13, wherein the two-dimensional channel region is pinched off in a range of 10-40 nanometers.

* * * * *